United States Patent [19]

Gudger

[11] Patent Number: 5,581,200

[45] Date of Patent: Dec. 3, 1996

[54] STORED AND COMBINATIONAL LOGIC FUNCTION GENERATOR WITHOUT DEDICATED STORAGE ELEMENTS

[76] Inventor: Keith H. Gudger, Box 336, Soquel, Calif. 95073

[21] Appl. No.: 499,737

[22] Filed: Jul. 7, 1995

Related U.S. Application Data

[63] Continuation of Ser. No. 206,516, Mar. 4, 1994, abandoned.

[51] Int. Cl.$^6$ ................................................ H03K 19/177
[52] U.S. Cl. ................................ 326/41; 326/40; 326/93
[58] Field of Search ............................. 307/465, 468, 307/469; 326/38–39, 41, 44, 40, 46, 93

[56] References Cited

U.S. PATENT DOCUMENTS

| | | | |
|---|---|---|---|
| 4,525,641 | 6/1985 | Cruz et al. | 307/465 |
| 4,677,318 | 6/1987 | Veenstra | 307/465 |
| 4,706,216 | 11/1987 | Carter | 365/94 |
| 4,717,912 | 1/1988 | Harvey et al. | 340/825.83 |
| 4,992,679 | 2/1991 | Takata et al. | 307/465 |
| 5,027,315 | 6/1991 | Agrawal et al. | 364/900 |
| 5,057,576 | 12/1991 | Cavlan | 307/465 |
| 5,164,612 | 11/1992 | Kaplinsky | 307/272.2 |
| 5,191,243 | 3/1993 | Shen et al. | 307/465 |
| 5,198,705 | 3/1993 | Galbraith et al. | 307/465 |
| 5,204,556 | 4/1993 | Shankar | 307/465 X |

FOREIGN PATENT DOCUMENTS

| | | | |
|---|---|---|---|
| 2267613 | 9/1947 | United Kingdom | H03K 19/173 |

OTHER PUBLICATIONS

"A Comparison of Universal Logic Module Realizations and Their Application in the Synthesis of Combinatorial and Sequential Logic Networks" by X. Chen & S. L. Hurst IEEE Transactions on Computers vol. C31 No. 2 Feb. 1982 pp. 140–147.

"Reduced Look–up Tables with Increased Functionality" Keith H. Gudger in 2nd Intl. ACM/SIGDA Workshop on Field Programmable Gate Arrays.

*Primary Examiner*—David R. Hudspeth

[57] ABSTRACT

A logic circuit which implements numerous logic functions, stored and combinational, without the use of flip-flops or different types of logic elements. This circuit provides a novel storage element which can emulate any logic function of its inputs. As shown in FIG. 8, a logic function generator (200) has at least three inputs. One input (218) responds to a control signal (202) and a second input (220) responds to a delayed function of the control signal (204). These two signals, in combination with the logic circuit output (210) and other input signals (206 and 208), produce the output (210). The stored version of these signals can change on either the rising or falling edge (or both) of the controlling signal. Other combinational signals are also available at the output. The circuit's flexibility arises from the programming of the data bits in the logic function generator, either fixed at time of manufacture or by user programmable means.

14 Claims, 8 Drawing Sheets

Fig. 1. Programmable Logic Device IC

Fig. 2. Field Programmable Gate Array IC

Fig. 3. Prior Art Output Structure

Fig. 4. Prior Art D/T Flip-Flop

Fig. 5. FPGA Logic Block

Fig. 6a. ULM.2 D-Latch

Fig. 6b. ULM JK-Flip-Flop

Fig. 8. Generalized Version

Fig. 7a. Programmable Clock Edges

Fig. 7b. Programmable Clock Edges

Fig. 9. Prior Art Programmable Flip-Flop

Fig 11. 4-Input Examples

Fig 12b. RLUT hook-up

Fig 12c. Adding Reset

Fig. 12a. Reduced LUT Version

STORED AND COMBINATIONAL LOGIC FUNCTION GENERATOR WITHOUT DEDICATED STORAGE ELEMENTS

This is a continuation of application Ser. No. 08/206,516 filed Mar. 4, 1994 now abandoned.

BACKGROUND

1. Field of Invention

The present invention relates to logic function generation devices, such as integrated circuits; specifically to programmable logic devices and field-programmable gate arrays.

BACKGROUND

2. Description of Prior Art

One use of integrated circuit (IC) technology is to implement logic functions. These integrated circuits (chips) operate on logic signals and produce logic signals. IC chip packages use "pins" to link external signals to the internal logic functions inputs and outputs.

Figure 1:
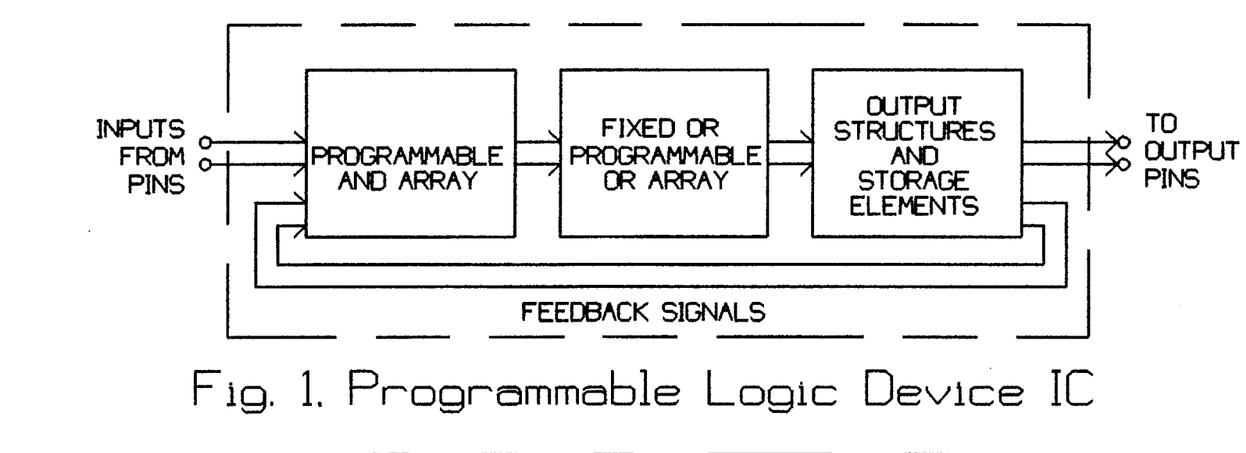
FIG. 1 illustrates a PLD type of integrated circuit.
Figure 3:
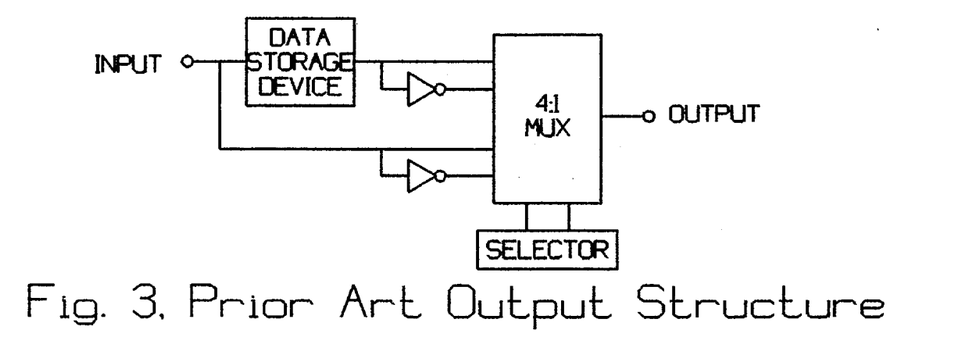
FIG. 3 is from U.S. Pat. No. 4,717,912 (Harvey et. al.) and shows a 4-input multiplexor combined with inverters and a 'D' flip-flop.
Figure 4:
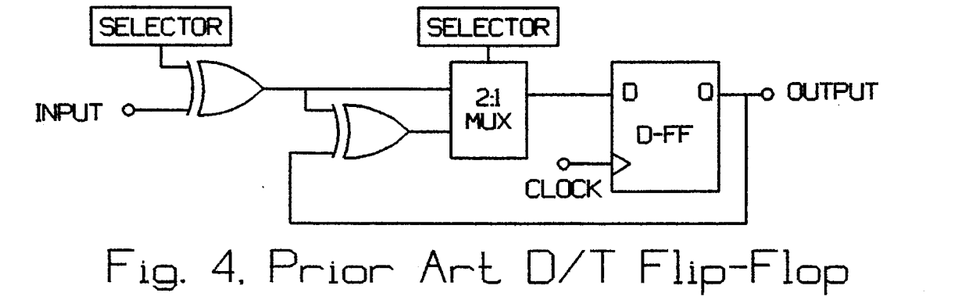
FIG. 4 is from U.S. Pat. No. 4,677,318 (Veenstra). The authors use an exclusive OR gate, a 2-input multiplexor and a 'D' flip-flop to emulate 'T' flip-flop functions.

One class of ICs provides logic functions that are user programmable. These chips use programmable structures to implement combinational and sequential logic functions. One type uses programmable AND arrays combined with programmable (or fixed) OR arrays to drive output structures (FIG. 1). This type of device is generally known as a programmable logic device (PLD). PLD output structures contain methods to produce different versions of the array's logic signals. In general, the output of the output structures can be the unchanged input signal, the inversion of the input signal, or a stored or inverted stored version of the input signal (FIG. 3). Prior work shows how to improve the stored version by including an exclusive OR gate. This provides a toggle ('T') flip-flop as well as a 'D' flip-flop (FIG. 4). Prior work also shows a programmable inverter on the clock signal (FIG. 7a) to store data on either the rising or falling edge of the clock.

Figure 2:
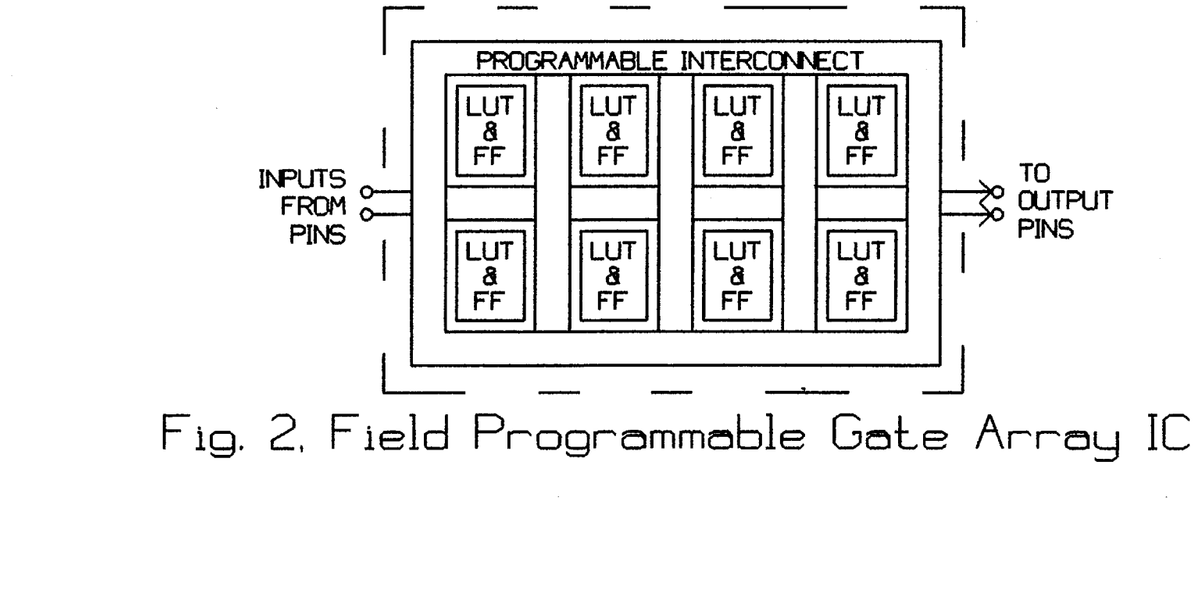
FIG. 2 illustrates an FPGA architecture for an integrated circuit.

One other type of user programmable IC is known as an FPGA (FIG. 2). An FPGA usually contains an array of logic function generators and programmable interconnect. One can roughly divide these devices into two types: one type uses look-up tables (LUTs) and the other type uses universal logic modules (ULMs). FPGA ULMs usually include multiplexors.

Figure 7A:
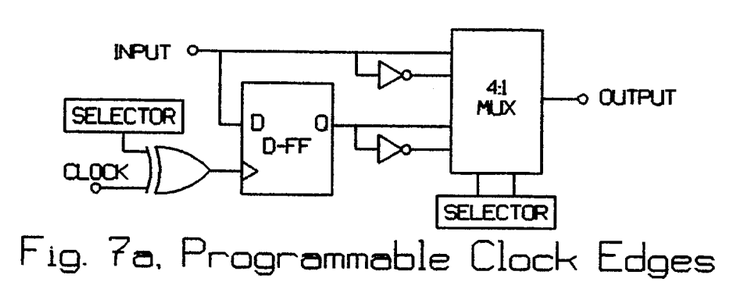

First let us look at how PLDs usually implement logic functions in their output structures. One well-known method (from U.S. Pat. No. 4,717,912 Harvey et. al., issued Jan. 5, 1988) uses a 4-input multiplexor combined with inverters and a D flip-flop (FIG. 3). This structure has many limitations. Improving this structure requires adding more logic gates and multiplexor inputs. In the case with the 4-input multiplexor, only the true or inverted input signals or the stored or inverted stored signals are available at the output. The stored signals are only of the D flip-flop variety. To get the true and false versions of other storage types requires at least two more inputs to the multiplexor for each storage type. Each storage element is fixed as to its function and which clock edge it responds to. An improvement on this work is in U.S. Pat. No. 5,027,315 (Agrawal and Breich, issued Jun. 25, 1991), which demonstrates the limitations mentioned (FIG. 7a). To include the ability to invert the clock to the flip-flop, the authors included a programmable inverter (prior art) in between the incoming clock signal and the 'D' flip-flop. This confirms that adding features to this circuit increases the complexity and decreases the speed of the device.

Figure 7B:
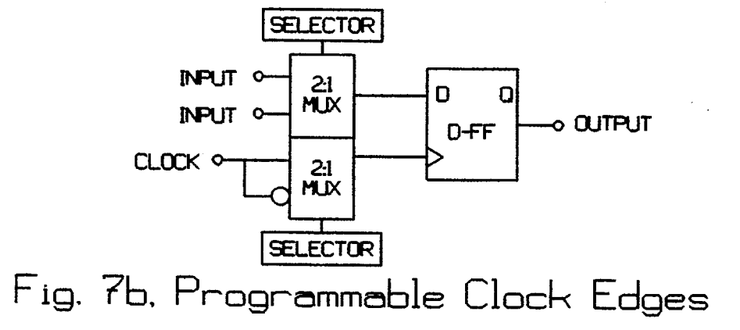

One known way to increase the variations of signals available at the output is to include a programmable exclusive OR (XOR) gate. This gate is at the input to the 'D' flip-flop (see U.S. Pat. No. 4,677,318 Veenstra, issued Jun. 30, 1987) (FIG. 4). One input to the XOR gate is the logic signal. The other input is the flip-flop 'Q' output. A two-input programmable multiplexor chooses between the input signal (true or inverted) or the XOR of the input and the output. When the multiplexor selects the XOR gate, the flip-flop becomes a 'T' flip-flop. 'T' flip-flops allow one easily to implement many additional types of flip-flops, including JK and RS. This figure includes another XOR gate to select the true or false version of the input signal. These extra multiplexors and gates increase the complexity of the circuit and introduce delay between the logic input and the flip-flop input. One improvement shown in U.S. Pat. No. 5,191,243 (Shen et. al., issued Mar. 2, 1993) is to provide the ability to clock the register on either edge (FIG. 7b). Shen uses a similar approach to Agrawal and Breich, but uses a two input multiplexor to select between the true or false clock signal. This again increases the circuit complexity and reduces the circuit performance.

Another method (U.S. Pat. No. 4,525,641, Cruz and Vermeulen, issued Jun. 25, 1985) combines a flip-flop with programmable logic arrays. This arrangement provides a flexible way to synthesize any type of flip-flop. Like the other patents, this patent discusses the combination of a programmable logic element with a flip-flop. It also does not address the programmable clocking issue.

Figure 9:
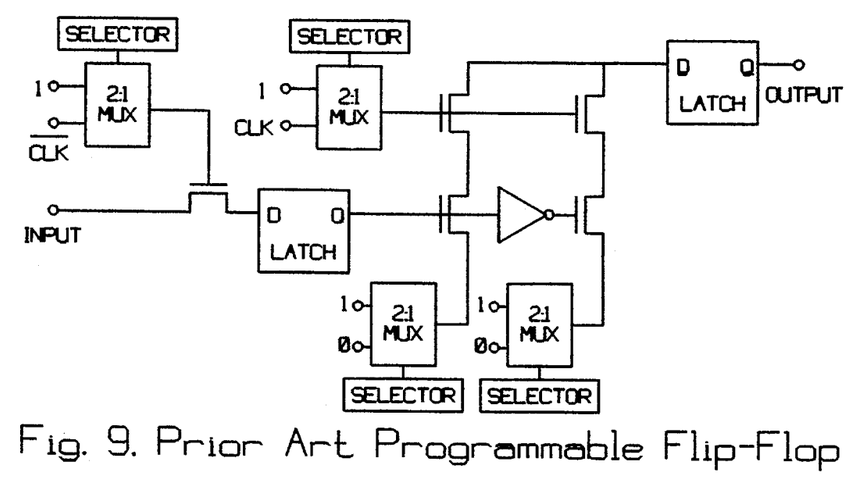
FIG. 9 shows a programmable flip-flop from U.S. Pat. No. 5,164,612 (Kaplinsky).

Kaplinsky (U.S. Pat. No. 5,164,612, issued Nov. 17, 1992) divides the flip-flop into two latches and provides clock control circuitry for both latches (FIG. 9). This circuit still has discrete latches and circuitry in series with the latch and clock inputs. One could easily combine the clocking multiplexors described in Shen or Agrawal and Breich to provide clocking on either the rising or falling edge. However, even if you combine elements from the various patents, many limitations remain.

One problem with all the approaches above (and their combinations) is that the storage element is fixed. In all cases the flip-flop is a master-slave device without the ability to by-pass either master or slave to provide a simple latching function. Also, the flip-flop changes state on only one edge of the clock signal (none provides the ability to sense both edges). Attempts to add other, new logic functions or types of storage devices increase the circuit complexity. Each new function requires two inputs and another two input multiplexor. Each of these multiplexors introduces more delay between the input and the output. Circuit complexity also increases.

Figure 5:
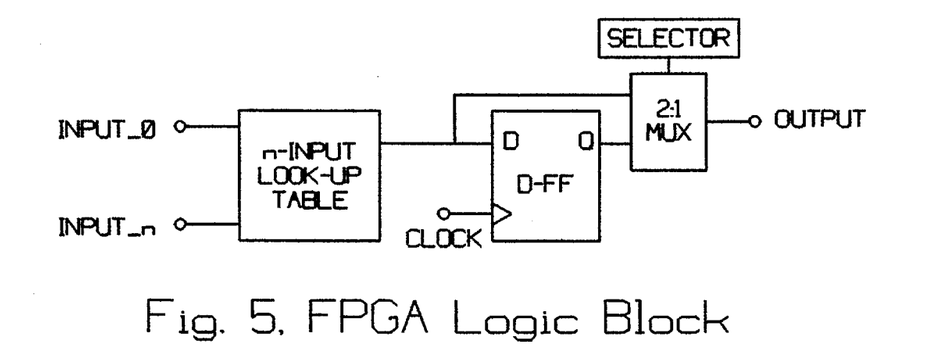
FIG. 5 is a simplified version of an FPGA logic block combining either an 'n' input look-up table or a universal logic module with a fixed 'D' flip-flop. (Prior art.)

FPGAs use look-up tables (LUTs) or universal logic modules (ULMs) to implement logic functions. LUT based FPGAs generally include a full 'D' flip-flop in their logic blocks, and current versions of ULM based FPGAs include 'D' flip-flops in 50% to 100% of their logic blocks (FIG. 5). An earlier version of a ULM based FPGA used one ULM to make a latch and cascaded two ULM latches to make a flip-flop. In all cases the programmable routing determines the particular clock edge which triggers the flip-flop. FPGA logic blocks implement latches with the LUT (or ULM), which wastes the fixed flip-flop. This wastes chip area. Currently all FPGAs have a ULM or LUT serially connected between the input and the flip-flop, delaying the input signals to the flip-flop.

Figure 6A:
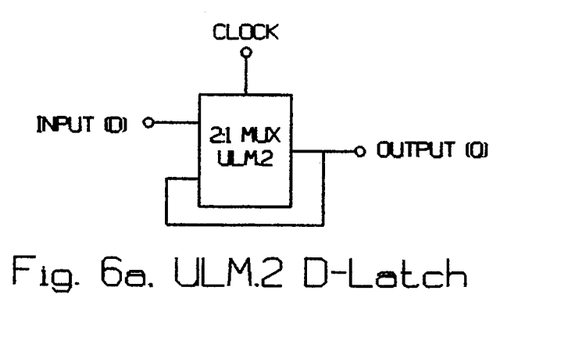
Figure 6B:
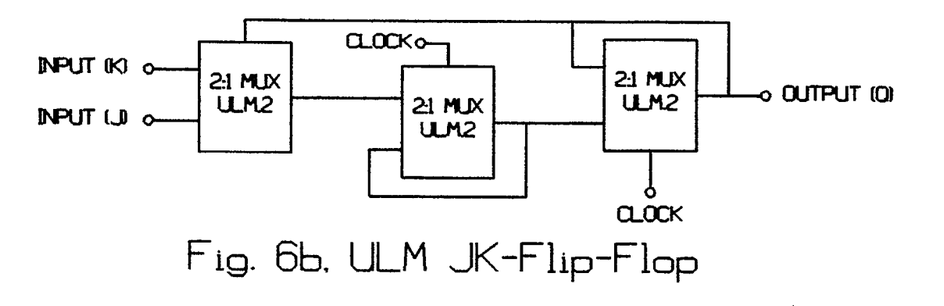

ULMs and LUTs have been used for many years to implement combinational and sequential logic functions. One of the simplest ULMs is a multiplexor (see Chen and Hurst's "A Comparison of Universal-Logic-Module Realizations and Their Application in the Synthesis of Combinatorial and Sequential Logic Networks", IEEE Transactions on Computers, Vol. c-31, No. 2, February 1982.) This work also showed ways to provide sequential functions using ULMs. Flip-flops made with ULMs combine ULM latches (FIG. 6a) in series. One clock signal drives two sequential 'D' latches to make a 'D' flip-flop. One inserts more ULMs in series to provide other functions, such as a 'JK' flip-flop (FIG. 6b). This serial nature slows down the function. The clock wiring determines which edge the flip-flop responds to. The wiring decisions come from a programmable routing structure which introduces extra delay.

OBJECTS AND ADVANTAGES

Accordingly, several objects and advantages of my invention are as follows. One advantage is the ability to provide multiple logic functions of the input signal, including but not limited to different storage functions. All signals are naturally available in true and false form. Storage can be a flow-through latch or a full flip-flop. Clocking can be on positive, negative, or both edges. Latches can be high or low active. Any logic function of the inputs can be stored or output directly. It is possible to add new functions after manufacture without affecting the complexity or speed delay of the device. This invention is extensible to as many logic inputs as desired.

Further objects and advantages of my invention will become apparent from a consideration of the drawings and ensuing description.

DESCRIPTION OF THE DRAWINGS

FIGS. 6a and 6b show universal logic modules (ULMs) connected to provide storage functions. FIG. 6a is a 'D' latch and 6b is a 'JK' flip-flop. These functions are shown in Chen and Hursts' "A Comparison of Universal-Logic-Module Realizations and Their Application in the Synthesis of Combinatorial and Sequential Logic Networks", IEEE Transactions on Computers, Vol. c-31, No. 2, Feb. 1982.

FIGS. 7a and 7b show programmable edge clocking options. FIG. 7a is from U.S. Pat. No. 5,027,315 (Agrawal and Breich), FIG. 7b from U.S. Pat. No. 4,525,641 (Cruz and Vermeulen).

FIGS. 12a–12c show how one can use reduced look-up tables (RLUTs) to simplify the use of the invention. FIG. 12a shows a symmetric hook-up which reduces the bits required from 16 to 8. This architecture can implement most of the required functions except 'T' flip-flops. FIG. 12b shows sample external RLUT connections. FIG. 12c shows how ULMs in the signal paths can increase the overall functionality. In this case a ULM.2 provides an asynchronous reset. (A ULM.2 is a universal logic module capable of producing all possible logic functions of two logic signals. It generally has at least three inputs.)

FIG. 13 shows some of the bit patterns for the RLUT version of the invention. The blank locations correspond to inversions of the non-blank locations as shown in FIG. 12a.

SUMMARY OF THE INVENTION

This apparatus implements numerous logic functions, stored and combinational, without the use of different types of logic elements or flip-flops. The present invention is a device which provides an output signal which is multiple versions of the input signal. One object of the invention is to provide an improved method and apparatus to implement complex logic functions and/or stored versions of these functions. A further object of the invention is to provide a novel storage element which can emulate any logic function of its inputs. Another object is that the stored version of these signals changes on either the rising or falling edge (or both) of the clocking signal. All of these functions arise from the programming of the data bits in the logic function generator, either fixed at time of manufacture or by user-programmable means.

DETAILED DESCRIPTION OF THE INVENTION

Structure of the Invention

Figure 8:
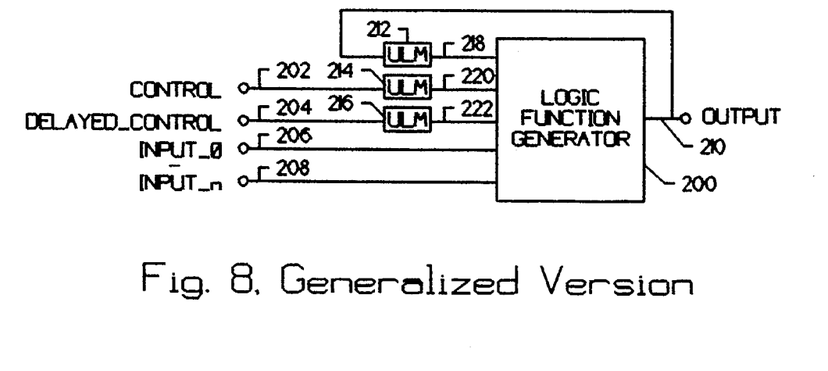
FIG. 8 is a generalized version of the current invention. Three of the inputs to the logic function generator are functions of the output, the control signal, and the delayed control signal. There can be 'n' inputs, as many as required to provide the appropriate logic function.

FIG. 8 shows a generalized structure of this invention. Input signals are on the left and an output signal is on the right. There are at least three inputs: a control signal 202, a delayed control signal 204, and output 210. These three inputs may first pass through universal logic modules (ULMs) or look-up tables (LUTs) or PLAs or any type of logic gate. Numbered 212, 214, and 216, these gates are fed by the respective input signals. These ULMs may have other input signals; these blocks and their extra inputs are not required for this invention to operate. The outputs of the ULMs, signals 218, 220, and 222 feed a logic function generator 200, which generates an output signal 210.

The logic function generator 200 may or may not have more inputs. These inputs can be any logic signal or combination of logic signals. In the drawing there is a first basic input 206 (INPUT_0) and a last logic input 208 (INPUT_n). Obviously, these signals may have ULMs, LUTs, PLAs, or logic gates in series with them.

The logic function generator 200 may be any type of logic circuit. Several possible circuits include look-up tables (LUTs), reduced LUTs (RLUTs), universal logic modules (ULMs), programmable logic arrays (PLAs), and logic gates.

Operation of the Invention

This simple logic device combines a control signal, a delayed control signal, and the logic device output. I will discuss one method to produce the delayed control signal later. The following discussion uses active high logic, where high is a '1'.

By definition a binary logic signal has two states (0 and 1). The combination of two binary signals produces four sets, {0,0}, {0,1}, {1,0}, {1,1}. For this circuit, the two binary signals are a control signal and a delayed version of the control signal. (Represented as {control, delayed_control}.) Initially, the two signals are {0,0} or {1,1}. At a sufficiently long time after the control signal changes state these two signals are {1,1} or {0,0}. Immediately after a low to high transition of the control signal the two signals are {1,0} and immediately after a high to low transition of the control signal the two signals are {0,1}. There are four distinct states: {0,0} and {1,1} are the two steady states and {1,0} and {0,1} are the transition states. One can use these four states to control combinational logic. This logic circuit can produce new logic signals which include stored versions of the inputs.

Figure 10:
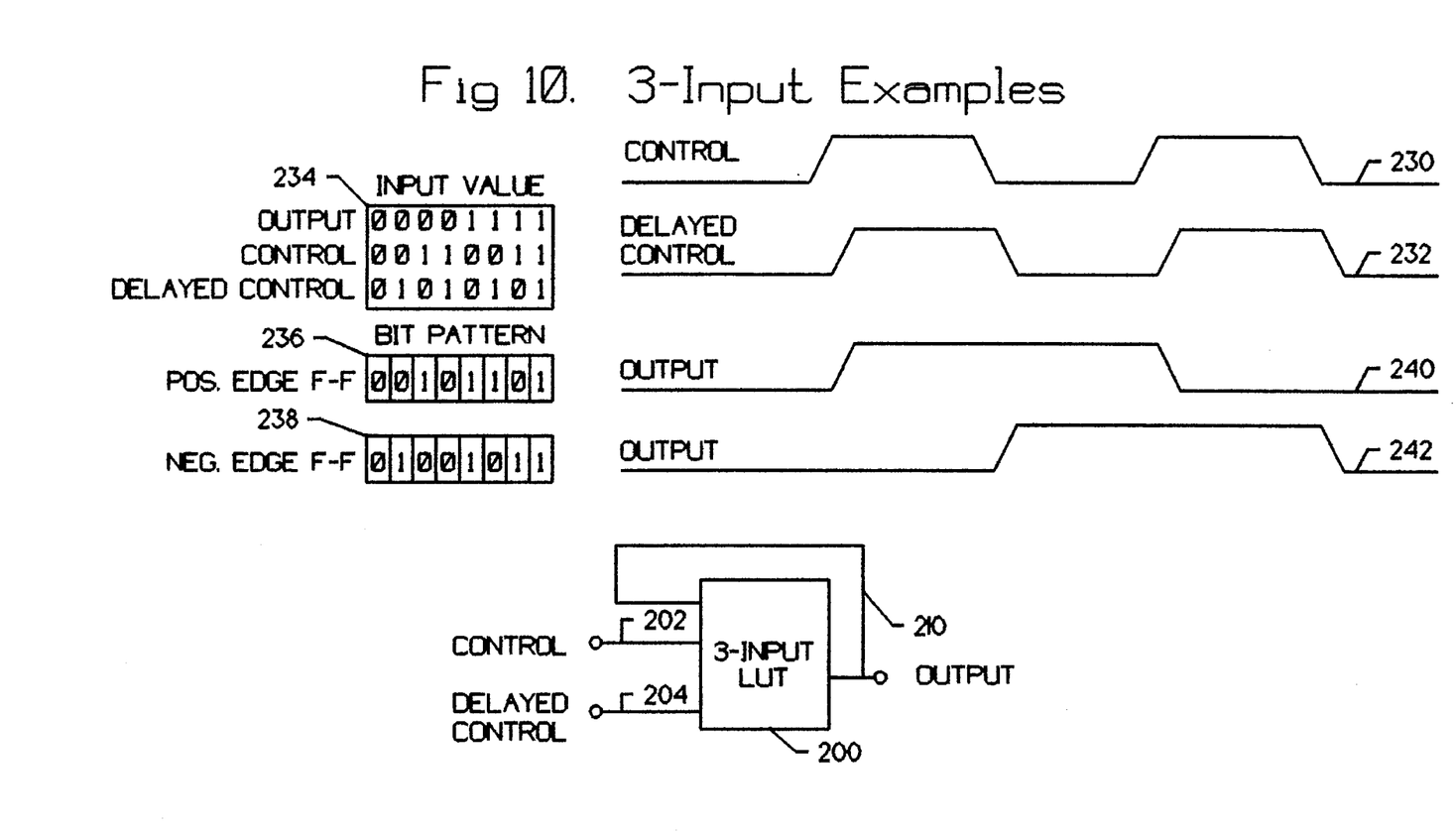
FIG. 10 shows the bit patterns for a 3-input version of the invention using a look-up table. Control and delayed control signals at the top, combined with the bit patterns shown, produce the output waveforms shown. This figure demonstrates two examples; the first is a positive and the second a negative edge triggered toggle flip-flop.

To describe the operation of the invention I will use the examples shown in FIGS. 10 through 13. FIG. 10 shows the operation of this invention with the minimal number of inputs (three). This example uses positive true logic and a three input, eight bit look-up table. The three inputs are the output 210, a control input 202 and a delayed control input 204. Box 234 shows the decoding pattern for the LUT bits. In this example, the output is the most significant input and the delayed control signal the least significant. Line 230 shows the timing diagram for the control signal. The timing diagram for the delayed control signal is shown by 232. Box 236 shows one possible bit pattern. This example, titled "Positive Edge Flip-Flop" produces the output signal shown by 240. Note that the output changes logic state when the control signal has a positive transition.

Here is how this circuit works. All 3 of the input signals are initially '0' and the data in the first square in box 236 (0) appears on the output, holding the output data at 0. When the control input changes to '1', the data in the third square of box 236 (1) appears at the output. The delayed control signal changes to a '1' at approximately the same time as the output changes at the input of the LUT. We now have all 3 LUT inputs equal to '1', and the output stays a '1' as shown. (Output data is in the last square of box 236).

The bit pattern shown in 238 produces the negative-edge triggered flip-flop action demonstrated by the output trace in 242. Other examples are possible but not shown.

Figure 11:
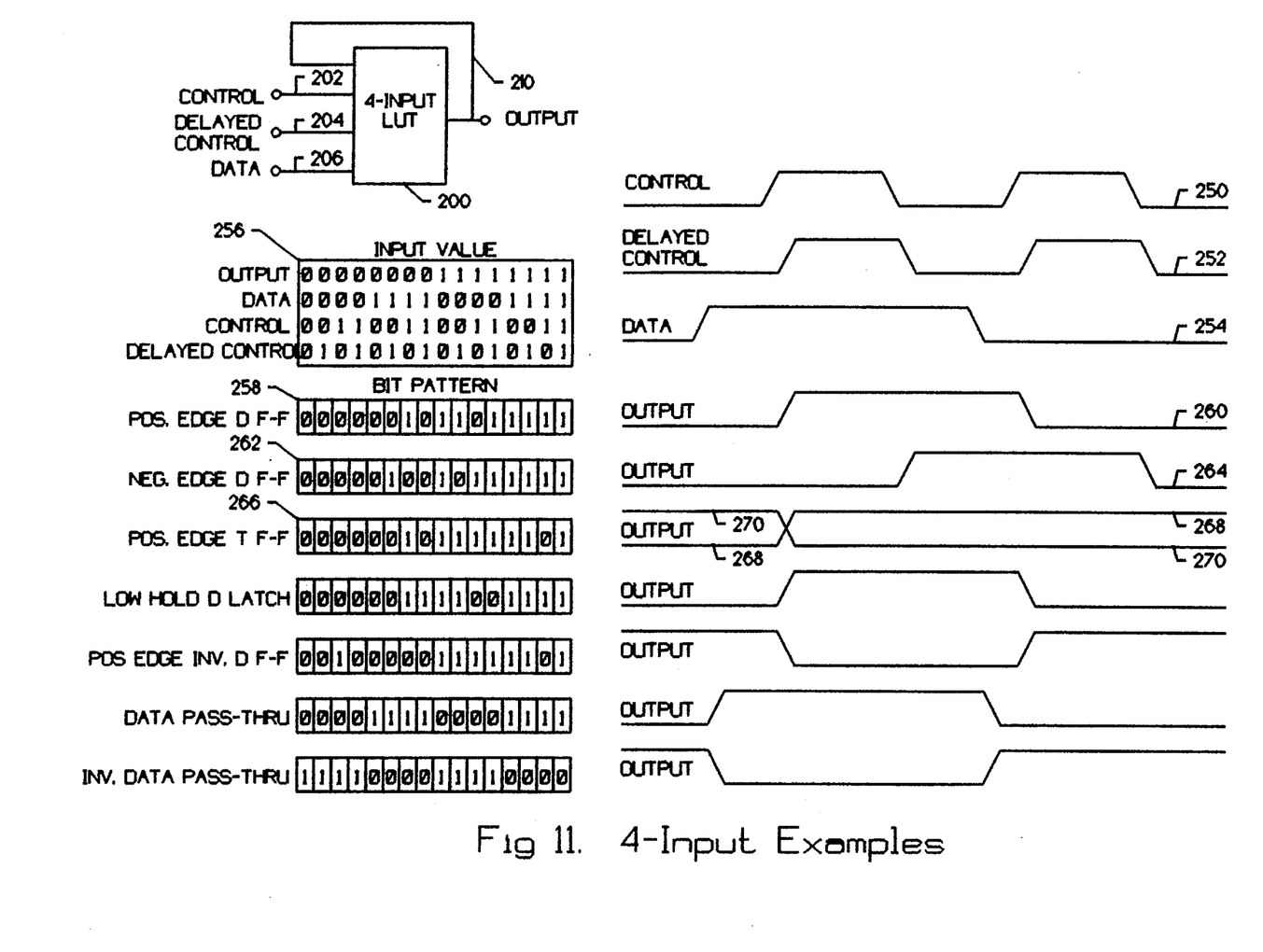
FIG. 11 shows some bit patterns for a 4-input version of the invention also using a look-up table. Control, delayed control, and input data signals are shown at the top right. This figure shows some possible uses of the invention. Note that input data can be inverted or true for every case. Also note that any storage type can be clocked on the rising or falling edge (or both edges). Input data can be stored or passed through. Data can be latched on the high or low states of the control signal.

FIG. 11 shows a more useful example. In this example a four input LUT 200 has a first input equal to the output 210, a second input, a control signal 202, a third input, a delayed control signal 204, and a fourth input 206 for data. The waveforms for the input signals are: control, 250; delayed control, 252; and data, 254. Box 256 contains the LUT decoding pattern. The first example implements a positive edge triggered D flip-flop. Box 258 shows the appropriate bit pattern. Line 250 shows the output signal. Bit pattern 262 implements a negative edge triggered D flip-flop with the output signal shown in 264. The bit pattern for a positive edge triggered T flip-flop is in box 266. Two outputs for this bit pattern are shown. Output trace 268 occurs when the output is initially '0', and output trace 270 occurs when the output is initially '1'. Four other examples are at the bottom of this figure. This invention can implement many more logic functions than those few shown here.

Figure 12A:
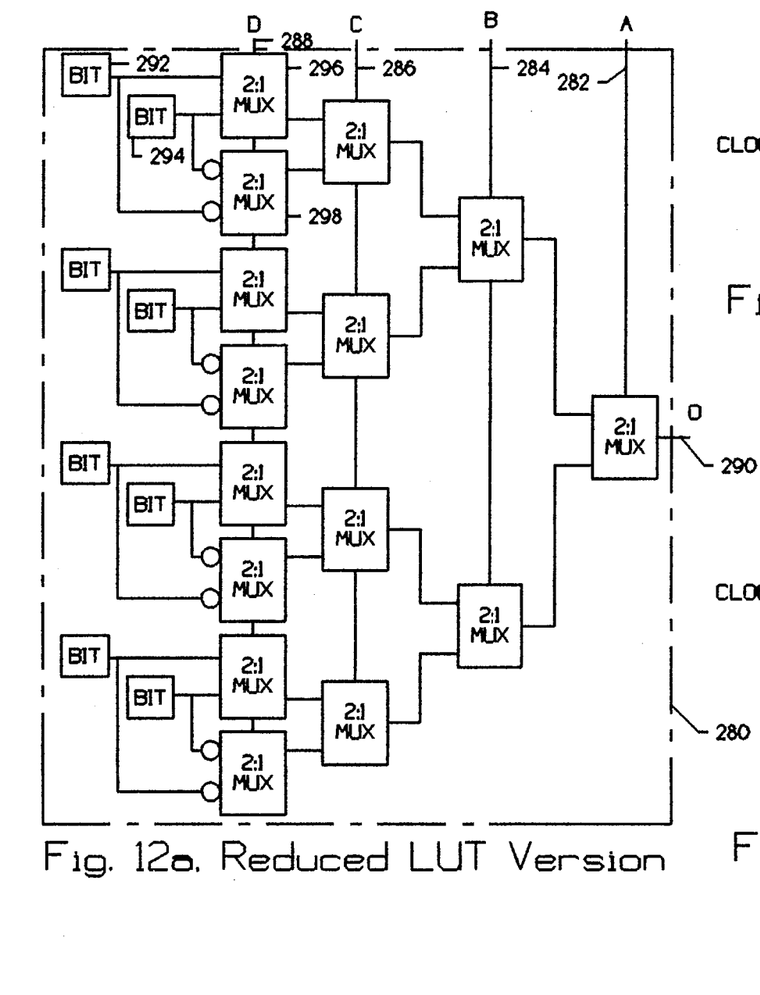
Figure 12B:
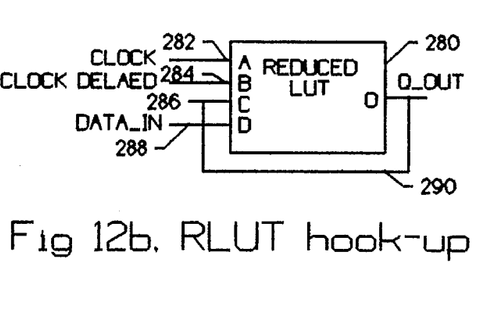
Figure 12C:
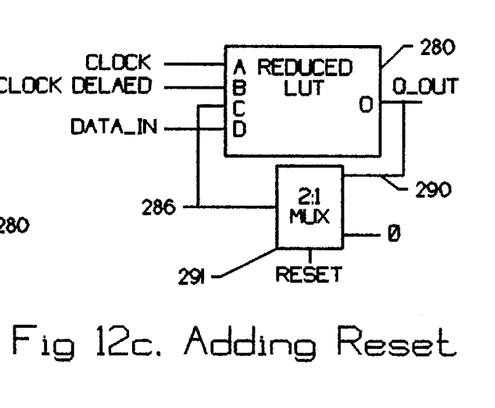

Methods to simplify multiplexor based logic are well known. Using these techniques, not all 16 bits are required for a 4-input look-up table. FIG. 12a shows one possible implementation. In this example the bit count is only 8 bits. Block 280 is a reduced LUT (RLUT). Inputs A (282), B (284), C (286) and D (288) drive 2 to 1 multiplexors which produce an output 290. Two bits (292 and 294) feed one multiplexor 296 and their inverses feed the next multiplexor 298. FIG. 12b shows the external connections for RLUT 280. Output 'Q_OUT' (290) is connected to input 'C' (286). FIG. 12c shows a similar example with a ULM.2 (291) between the output 290 and the 'C' input 286. This multiplexor provides an asynchronous reset function for the flip-flop implementations.

Figure 13:
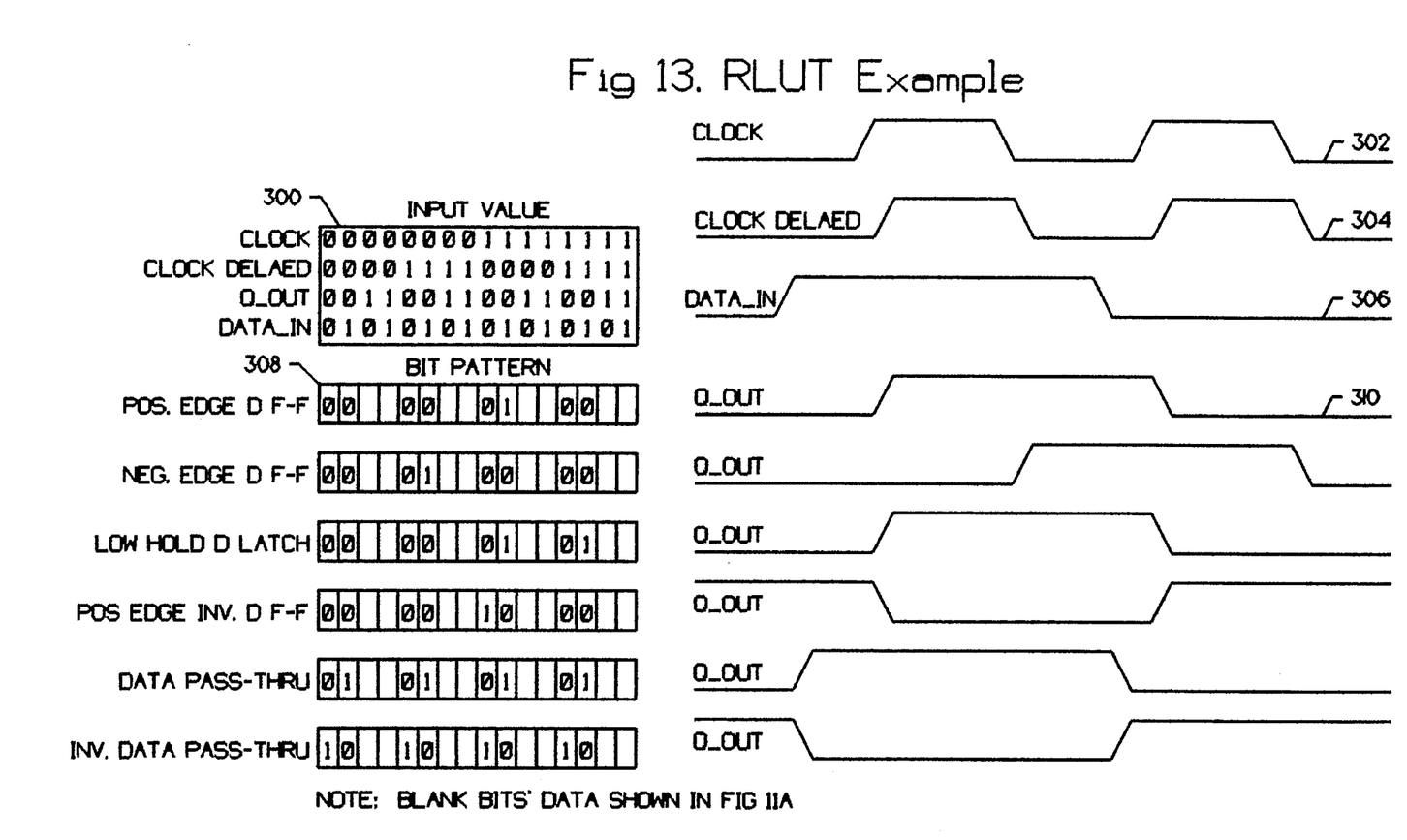

FIG. 13 shows an example using the RLUT 280 connected as in FIG. 11b. Box 300 shows the decoding pattern for the 4 inputs. The clock input waveform is 302, the delayed clock input waveform is 304, and the data in waveform is 306. Box 308 is the bit pattern for a positive edge-triggered 'D' flip-flop. The box shows eight bits of data—the eight holes in box 308 derive their data as shown in FIG. 12a. Waveform 310 shows the output. This figure shows six examples. The RLUT structure significantly reduces the bits required while only slightly limiting the useful output functions.

One method to produce the delayed control (clock) signal is to use the same logic function generator in the delayed signal logic chain as is used to generate these logic functions. For the 4-input RLUT example, a 4-input RLUT has inputs A (282), B (284) and D (288) tied to either 1 or 0, and input C (286) tied to the control (clock) signal. The output O (290, Q_OUT) of this 4-input RLUT generates the delayed control (clock) signal.

Conclusions, Ramifications, and Scope of Invention

This invention provides a simple, uniform and fast way to produce registered and combinational signals with combinational logic.

While my above description contains many specificities, these should not be construed as limitations on the scope of the invention, but rather as examples of some of the preferred embodiments. Many other variations are possible. Accordingly, the scope of the invention should be determined not by the embodiments illustrated, but by the appended claims and their legal equivalents.

I claim:

1. A logic circuit comprising:

a logic function generator circuit composed only of combinational logic, having at least three inputs and at least one output, and a first input means for receiving a control signal and providing a logical function of said control signal to a first of said at least three inputs, a second input means, composed only of combinational logic, for receiving said control signal and providing a logical delay function of said control signal to a second of said at least three inputs, said logic delay function having a delay substantially equal to a total delay through said logic function generator circuit from one of said at least three inputs to said at least one output, a third input means for receiving an output signal present at said at least one output, and providing a logical feedback function of said output signal to a third of said at least three inputs, wherein said logic function generator circuit may provide combinational and sequential logic functions of said logical function, said logical logically delayed function and said logical feedback function at said at least one output.

2. The logic circuit of claim 1 wherein said function generator is configured by user programmable means, whereby end users can cause combinational and sequential logic signals to be produced at the output.

3. The logic circuit of claim 1 wherein the connection of said inputs is configured by user programmable means.

4. The logic circuit of claim 1 wherein said function generator is comprised of a logic circuit selected from the group consisting of a look up table, and a universal logic module, and a programmable logic array, and logic gates.

5. The logic circuit of claim 1 wherein said function generator is any combination of logic circuits selected from the group consisting of a look up table, and a universal logic module, and a programmable logic array, and logic gates.

6. The logic circuit of claim 1 wherein said function generator has at least four inputs with a fourth input means for receiving any logic signal and providing a logical function of said logic signal to a fourth of said at least four inputs.

7. The logic circuit of claim 1 wherein said inputs first pass through logic gates and said inputs are functions of other signals as well.

8. A method using only combinational logic for producing a plurality of logic signals at the output of a logic circuit, said logic circuit comprising a logic function generator circuit composed only of combinational logic, having at least three inputs and at least one output, and a first input means for receiving a control signal and providing a logical function of said control signal to a first of said at least three inputs, a second input means, composed only of combinational logic, for receiving said control signal and providing a logical delay function of said control signal to a second of said at least three inputs, said logic delay function having a delay substantially equal to a total delay through said logic function generator circuit from one of said at least three inputs to said at least one output, a third input means, for receiving an output signal present at said at least one output, and providing a logical feedback function of said output signal to a third of said at least three inputs, wherein said logic function generator circuit may provide combinational and sequential logic functions of said logical function, said logical logically delayed function and said logical feedback function at said at least one output.

9. The method for producing logic signals of claim 8 wherein the method of programming said function generator is by user programmable means, whereby end users can cause combinational and sequential logic signals to be produced at the output.

10. The method for producing logic signals of claim 8 wherein the method of connecting said inputs is by user programmable means.

11. The method for producing logic signals of claim 8 wherein the method of implementing said function generator is comprised of a logic circuit selected from the group consisting of a look up table, and a universal logic module, and a programmable logic array, and logic gates.

12. The method for producing logic signals of claim 8 wherein the method of implementing said function generator is any combination of logic circuits selected from the group consisting of a look up table, and a universal logic module, and a programmable logic array, and logic gates.

13. The method for producing logic signals of claim 8 wherein said function generator has at least four inputs with a fourth input means for receiving any logic signal and providing a logical function of said logic signal to a fourth of said at least four inputs.

14. The method for producing logic signals of claim 8 wherein the method of producing said inputs includes that said inputs first pass through logic gates and said inputs are functions of other signals as well.

* * * * *